(12) United States Patent
Lim et al.

(10) Patent No.: US 9,847,333 B2
(45) Date of Patent: Dec. 19, 2017

(54) REDUCING RISK OF PUNCH-THROUGH IN FINFET SEMICONDUCTOR STRUCTURE

(71) Applicant: GLOBALFOUNDRIES Inc., Grand Cayman (KY)

(72) Inventors: Kwanyong Lim, Niskayuna, NY (US); Murat Kerem Akarvardar, Saratoga Springs, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/051,420

(22) Filed: Feb. 23, 2016

(65) Prior Publication Data

US 2016/0268260 A1 Sep. 15, 2016

Related U.S. Application Data

(60) Provisional application No. 62/130,401, filed on Mar. 9, 2015.

(51) Int. Cl.
*H01L 29/16* (2006.01)
*H01L 27/092* (2006.01)
*H01L 21/8238* (2006.01)
*H01L 29/167* (2006.01)

(52) U.S. Cl.
CPC .. *H01L 27/0924* (2013.01); *H01L 21/823807* (2013.01); *H01L 21/823821* (2013.01); *H01L 29/167* (2013.01); *H01L 21/823892* (2013.01)

(58) Field of Classification Search
CPC .......................... H01L 27/0924; H01L 29/167
See application file for complete search history.

(56) References Cited

U.S. PATENT DOCUMENTS

| 7,253,118 | B2 * | 8/2007 | Tran | H01L 21/0337 257/E21.038 |
| 7,385,237 | B2 * | 6/2008 | Lee | H01L 29/66795 257/213 |
| 7,544,994 | B2 * | 6/2009 | Schepis | H01L 21/845 257/302 |
| 7,545,008 | B2 * | 6/2009 | Chan | H01L 21/845 257/350 |
| 7,687,351 | B2 * | 3/2010 | Oyu | H01L 21/823412 257/E21.159 |
| 7,781,273 | B2 * | 8/2010 | Schepis | H01L 21/845 257/E21.179 |
| 7,795,088 | B2 * | 9/2010 | Hsu | H01L 21/28282 257/324 |

(Continued)

*Primary Examiner* — Ida M Soward
(74) *Attorney, Agent, or Firm* — Wayne F. Reinke, Esq.; Heslin Rothenberg Farley & Mesiti P.C.

(57) ABSTRACT

Reducing a chance of punch-through in a FinFET structure includes providing a substrate, creating a blanket layer of semiconductor material with impurities therein over the substrate, masking a portion of the blanket layer, creating epitaxial semiconductor material on an unmasked portion of the structure, removing the mask, and etching the structure to create n-type raised structure(s) and p-type raised structure(s), a bottom portion of the raised structure(s) being surrounded by isolation material. A middle portion of the raised structure(s) includes a semiconductor material with impurities therein, the middle portion extending across the raised structure(s), and a top portion including a semiconductor material lacking added impurities.

12 Claims, 5 Drawing Sheets

(56) References Cited

U.S. PATENT DOCUMENTS

| | | | | |
|---|---|---|---|---|
| 8,497,171 B1* | 7/2013 | Wu | H01L 21/823821 | 438/199 |
| 8,575,596 B2* | 11/2013 | Pillarisetty | B82Y 10/00 | 257/24 |
| 8,575,708 B2* | 11/2013 | Lin | H01L 29/66795 | 257/327 |
| 8,673,718 B2* | 3/2014 | Maszara | H01L 29/66795 | 438/268 |
| 8,822,343 B2* | 9/2014 | Hsieh | G03F 7/70683 | 257/797 |
| 8,835,268 B2* | 9/2014 | Sudo | H01L 27/228 | 257/E21.619 |
| 8,846,490 B1* | 9/2014 | Shieh | H01L 29/06 | 257/499 |
| 8,860,107 B2* | 10/2014 | Haensch | H01L 21/823431 | 257/296 |
| 8,933,528 B2* | 1/2015 | Utomo | H01L 29/785 | 257/347 |
| 9,006,786 B2* | 4/2015 | Ching | H01L 29/7856 | 257/188 |
| 9,023,705 B1* | 5/2015 | Paul | H01L 21/823431 | 438/283 |
| 9,024,364 B2* | 5/2015 | Okano | H01L 29/42392 | 257/255 |
| 9,041,062 B2* | 5/2015 | Cheng | H01L 27/1211 | 257/192 |
| 9,224,865 B2* | 12/2015 | Akarvardar | H01L 29/785 | |
| 9,263,535 B2* | 2/2016 | Colinge | H01L 29/785 | |
| 9,276,117 B1* | 3/2016 | Lee | H01L 29/785 | |
| 9,293,587 B2* | 3/2016 | Jacob | H01L 29/785 | |
| 9,306,069 B2* | 4/2016 | Ching | H01L 29/7842 | |
| 9,343,371 B1* | 5/2016 | Wu | H01L 21/823821 | |
| 9,343,559 B2* | 5/2016 | Glass | H01L 29/66545 | |
| 9,362,277 B2* | 6/2016 | Chi | H01L 27/0886 | |
| 9,653,605 B2* | 5/2017 | Zhang | H01L 29/7851 | |
| 2009/0200540 A1* | 8/2009 | Bjoerk | H01L 29/0673 | 257/20 |
| 2011/0068431 A1* | 3/2011 | Knorr | H01L 21/76229 | 257/506 |
| 2011/0081764 A1* | 4/2011 | Maszara | H01L 29/785 | 438/413 |
| 2014/0159126 A1* | 6/2014 | Wei | H01L 29/66795 | 257/288 |
| 2014/0175554 A1* | 6/2014 | Loubet | H01L 21/823431 | 257/368 |
| 2015/0008490 A1* | 1/2015 | Strain | H01L 29/66795 | 257/288 |
| 2015/0060959 A1* | 3/2015 | Lin | H01L 29/785 | 257/288 |
| 2015/0069458 A1* | 3/2015 | Li | H01L 29/66795 | 257/105 |
| 2015/0097239 A1* | 4/2015 | Chen | H01L 23/3171 | 257/347 |
| 2015/0123212 A1* | 5/2015 | Hu | H01L 21/3086 | 257/401 |
| 2015/0123214 A1* | 5/2015 | Wei | H01L 29/66795 | 257/401 |
| 2015/0129983 A1* | 5/2015 | Yu | H01L 29/7848 | 257/401 |
| 2015/0162434 A1* | 6/2015 | Loubet | H01L 29/785 | 257/347 |
| 2015/0263159 A1* | 9/2015 | Ching | H01L 29/785 | 257/77 |
| 2015/0364605 A1* | 12/2015 | Zhu | H01L 29/66795 | 257/365 |
| 2016/0087101 A1* | 3/2016 | Shin | H01L 29/66568 | 257/192 |
| 2016/0126343 A1* | 5/2016 | Ching | H01L 29/785 | 257/192 |
| 2016/0181414 A1* | 6/2016 | Huang | H01L 29/785 | 257/401 |
| 2016/0211262 A1* | 7/2016 | Jan | H01L 21/823821 | |
| 2016/0218104 A1* | 7/2016 | Wen | H01L 21/845 | |
| 2016/0225659 A1* | 8/2016 | Jacob | H01L 21/76213 | |
| 2016/0225674 A1* | 8/2016 | Jacob | H01L 21/823821 | |
| 2016/0225771 A1* | 8/2016 | Wu | H01L 21/823821 | |
| 2016/0329403 A1* | 11/2016 | Kavalieros | H01L 29/66795 | |
| 2016/0379981 A1* | 12/2016 | Balakrishnan | H01L 27/0924 | 257/192 |
| 2017/0054026 A1* | 2/2017 | Rachmady | B82Y 10/00 | |
| 2017/0162453 A1* | 6/2017 | Pillarisetty | H01L 21/845 | |

* cited by examiner

REDUCING RISK OF PUNCH-THROUGH IN FINFET SEMICONDUCTOR STRUCTURE

CROSS-REFERENCE TO RELATED APPLICATIONS

This application claims priority under 35 U.S.C. §119 to U.S. Provisional Application No. 62/130,401, filed Mar. 9, 2015, which is herein incorporated by reference in its entirety.

TECHNICAL FIELD

The present invention generally relates to fabrication of non-planar semiconductor devices. More particularly, the present invention relates to punch-through stops in FinFET (i.e., transistors built on "fins") semiconductor structures.

BACKGROUND INFORMATION

Punch-through, channel length reduced to the point where a parasitic current arises from source to drain, is an ever-present threat in FinFET type semiconductor devices. In the past, punch-through stops (PTS) via conventional implant through the fin have been used to combat punch-through. However, a conventional implant has drawbacks, in particular, a lack of impurity containment in the fin, resulting in impurities with a high diffusivity and resulting loss in performance.

Thus, a need continues to exist for a way to further reduce the risk of punch-through as compared to conventional PTS implant.

SUMMARY OF THE INVENTION

The shortcomings of the prior art are overcome and additional advantages are provided through the provision, in one aspect, of a method of reducing a chance of punch-through in a FinFET structure. The method includes providing a substrate, creating a blanket layer of semiconductor material with impurities therein over the substrate, masking a portion of the blanket layer, creating epitaxial semiconductor material on an unmasked portion of the structure, removing the mask, and etching the structure to create at least one n-type raised structure and at least one p-type raised structure.

In accordance with another aspect, a semiconductor structure is provided. The semiconductor structure includes a substrate, and at least one semiconductor fin coupled to the substrate, a bottom portion of the at least one semiconductor fin being surrounded by isolation material. A middle portion of the at least one semiconductor fin includes a semiconductor material with impurities therein, the middle portion extending across the at least one semiconductor fin, and a top portion of the semiconductor fin including a semiconductor material lacking added impurities. The semiconductor material with impurities therein includes epitaxial semiconductor material, the semiconductor structure includes a n-type region and a p-type region, and the epitaxial semiconductor material with impurities therein includes boron-doped epitaxial silicon germanium These, and other objects, features and advantages of this invention will become apparent from the following detailed description of the various aspects of the invention taken in conjunction with the accompanying drawings.

DETAILED DESCRIPTION OF THE INVENTION

Figure 1:
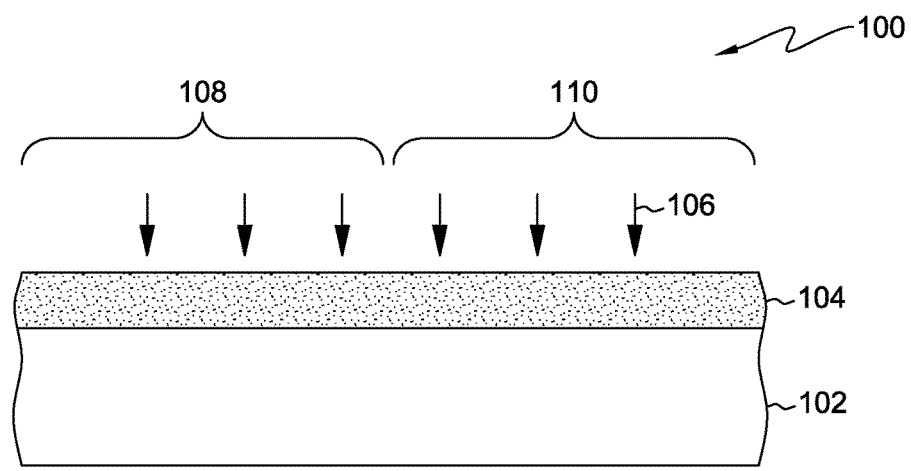
FIG. 1 is a cross-sectional view of one example of a starting semiconductor structure, the structure including a semiconductor substrate and a blanket layer of semiconductor material with impurities therein (e.g., arsenic or phosphorous doped silicon), the structure including a n-type region on the left and a p-type region on the right, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components. Further, unless otherwise specified, a given portion of the described process can be accomplished using conventional semiconductor device processes and techniques, such as, for example, doping, deposition, etching (wet or dry), annealing, growing epitaxial material, metallization, etc.

FIG. 1 is a cross-sectional view of one example of a starting semiconductor structure 100, the structure including a semiconductor substrate 102 and a blanket layer 104 of semiconductor material with impurities 106 therein (e.g., arsenic or phosphorous doped silicon), the structure including a designated n-type region 108 on the left and a designated p-type region 110 on the right, in accordance with one or more aspects of the present invention. In one example, an anneal may follow a deposition of the blanket layer.

The starting structure may be conventionally fabricated, for example, using known processes and techniques. Further, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
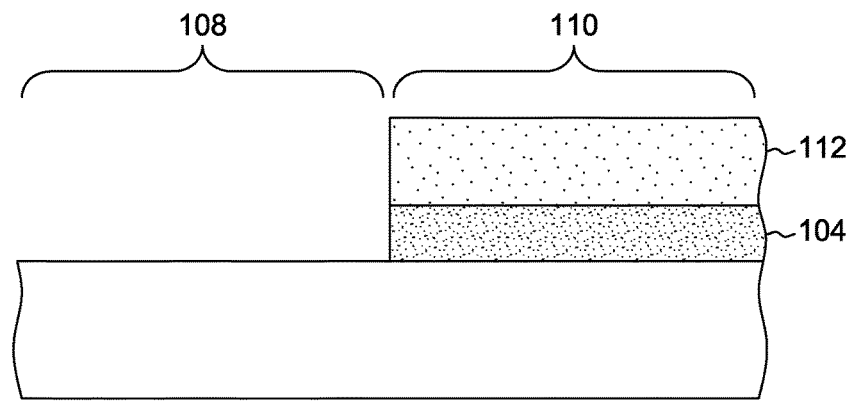
FIG. 2 depicts one example of the starting structure of FIG. 1 after creating a layer of hard mask material over a portion (here, the p-type region) of the blanket layer and removing the blanket layer over the unmasked portion (here, the n-type region), in accordance with one or more aspects of the present invention.

FIG. 2 depicts one example of the starting structure of FIG. 1 after creating a layer 112 of hard mask material (e.g., by deposition) over a portion (here, p-type region 110) of the blanket layer 104 and removing the blanket layer, e.g., by etching, over the unmasked portion (here, n-type region 108), in accordance with one or more aspects of the present invention.

Figure 3:
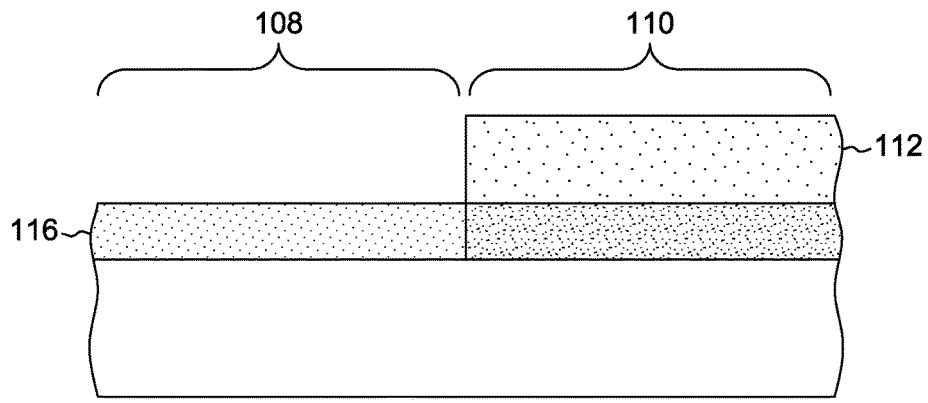
FIG. 3 depicts one example of the structure of FIG. 2 after creating a layer of epitaxial semiconductor material with impurities therein over the n-type region (e.g., boron-doped epitaxial silicon germanium), in accordance with one or more aspects of the present invention.

FIG. 3 depicts one example of the structure of FIG. 2 after creating a layer 116 of epitaxial material with impurities therein over the n-type region 108 (e.g., boron-doped epitaxial silicon germanium), e.g., by growing the epitaxy and implanting with boron, in accordance with one or more aspects of the present invention.

Figure 4:
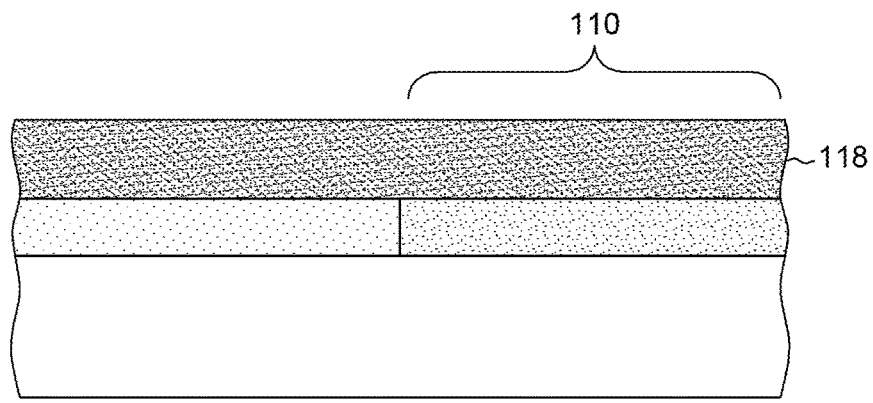
FIG. 4 depicts one example of the structure of FIG. 3 after removing the layer of hard mask material over the p-type region and creating a blanket layer of epitaxial semiconductor material lacking impurities (e.g., undoped epitaxial silicon), in accordance with one or more aspects of the present invention.

FIG. 4 depicts one example of the structure of FIG. 3 after removing the layer (112, FIG. 3) of hard mask material over the p-type region 110, e.g., by etching, and creating a blanket layer 118 of epitaxial semiconductor material lacking impurities (e.g., undoped epitaxial silicon), e.g., by growing the epitaxial material, in accordance with one or more aspects of the present invention.

Figure 5:
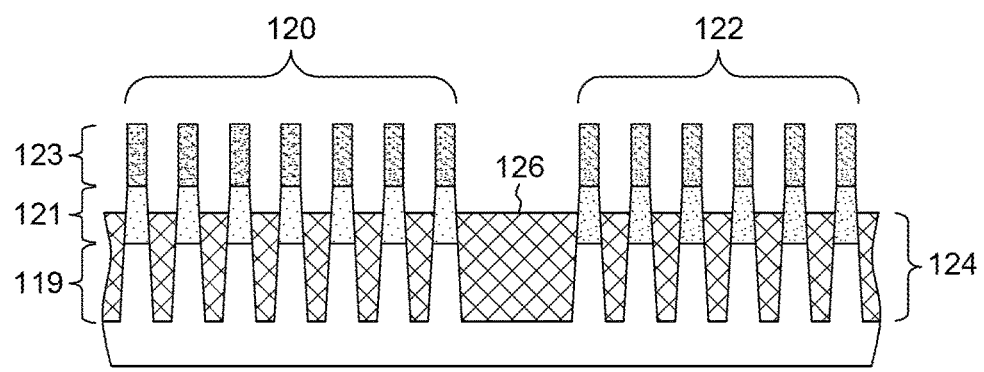
FIG. 5 depicts one example of the structure of FIG. 4 after etching the structure to create one or more raised semiconductor structures (here, fins) in each region, and surrounding a bottom portion of the raised structures with a layer of isolation material, in accordance with one or more aspects of the present invention.

FIG. 5 depicts one example of the structure of FIG. 4 after etching the structure to create one or more raised semiconductor structures in both the n and p-type regions (here, fins 120 and 122, respectively), and surrounding a bottom portion 124 of the fins with a layer 126 of isolation material, e.g., by conformal deposition, in accordance with one or more aspects of the present invention. Each fin includes a bottom portion 119, middle portion 121 and top portion 123.

As noted above, the raised structures may take the form of "fins," and may be etched from a bulk substrate. They may also include, for example, any of the materials listed above with respect to the substrate. Further, some or all of the raised structure(s) may include added impurities (e.g., by doping), making them n-type or p-type. In this case, the middle portion of each fin includes a punch-through stop (PTS) covered by a layer of undoped epitaxial material.

Figure 14:
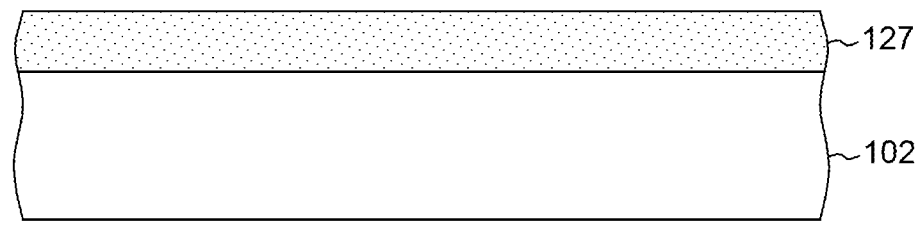
FIG. 14 depicts another example of a variant of the starting structure of FIG. 1, including a blanket layer of an epitaxial semiconductor material with impurities therein (e.g., boron-doped epitaxial silicon germanium), instead of a layer of non-epitaxial semiconductor material with impurities, in accordance with one or more aspects of the present invention.

FIG. 14 depicts one example of a variant of the starting structure of FIG. 1, including blanket layer 127 of an epitaxial semiconductor material with impurities therein (e.g., boron-doped epitaxial silicon germanium), e.g., by growth of the epitaxy and implanting boron, instead of a layer of non-epitaxial semiconductor material with impurities, in accordance with one or more aspects of the present invention.

Figure 6:
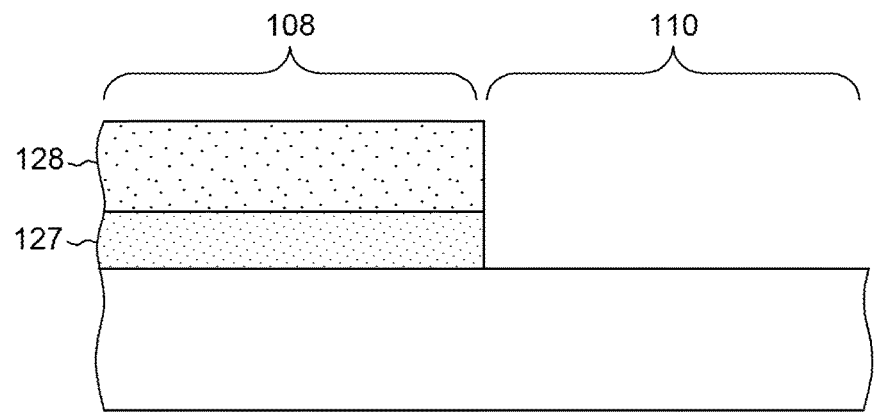
FIG. 6 depicts one example of the starting structure of FIG. 1 after creating a layer of hard mask material over another portion (here, the n-type region) of the blanket layer and removing the blanket layer over the unmasked portion (here, the p-type region), in accordance with one or more aspects of the present invention.

FIG. 6 depicts one example of the structure of FIG. 14 after creating a layer 128 of hard mask material, e.g., by deposition, over another portion (here, the n-type region 108) of the blanket layer 127 and removing, e.g., by etching, the blanket layer over the unmasked portion (here, the p-type region 110), in accordance with one or more aspects of the present invention.

Figure 7:
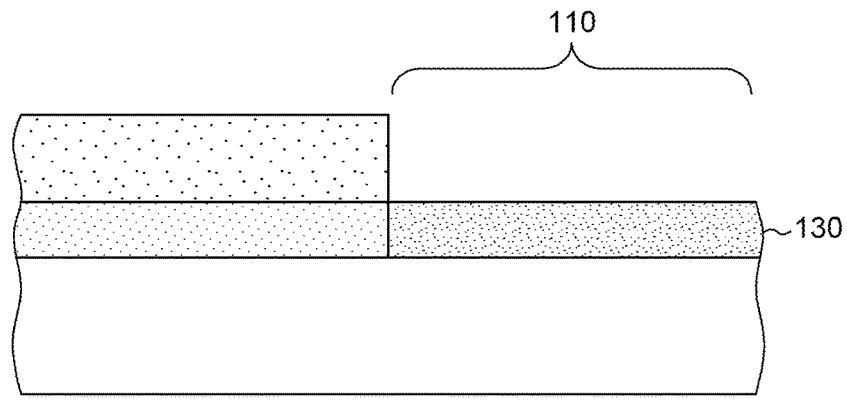
FIG. 7 depicts one example of the structure of FIG. 6 after creating a layer of epitaxial semiconductor material with impurities therein (e.g., phosphorous or arsenic doped epitaxial silicon) over the unmasked portion (here, the p-type region), in accordance with one or more aspects of the present invention.

FIG. 7 depicts one example of the structure of FIG. 6 after creating a layer 130 of epitaxial semiconductor material with impurities therein (e.g., phosphorous or arsenic doped epitaxial silicon), e.g., by epitaxy growth and arsenic implant, over the unmasked portion (here, the p-type region 110), in accordance with one or more aspects of the present invention.

Figure 8:
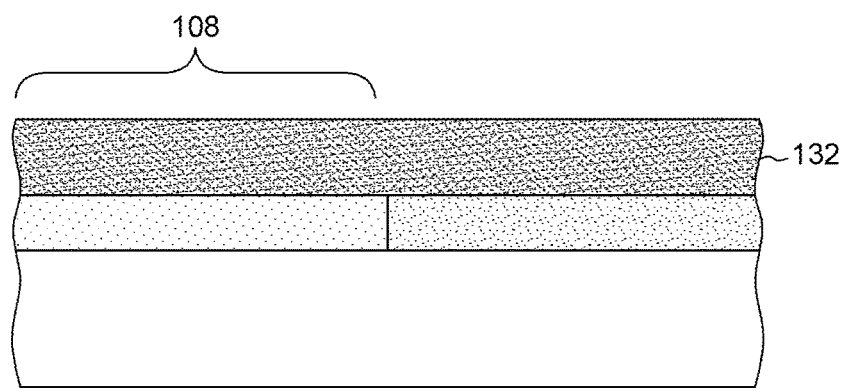
FIG. 8 depicts one example of the structure of FIG. 7 after removing the layer of hard mask material over the n-type region, and creating a blanket layer of epitaxial semiconductor material lacking impurities (e.g., undoped epitaxial silicon), in accordance with one or more aspects of the present invention.

FIG. 8 depicts one example of the structure of FIG. 7 after removing the layer (128, FIG. 6) of hard mask material over the n-type region 108, e.g., by etching, and creating a blanket layer 132 of epitaxial semiconductor material lacking impurities (e.g., undoped epitaxial silicon), e.g., by growth, in accordance with one or more aspects of the present invention.

Figure 9:
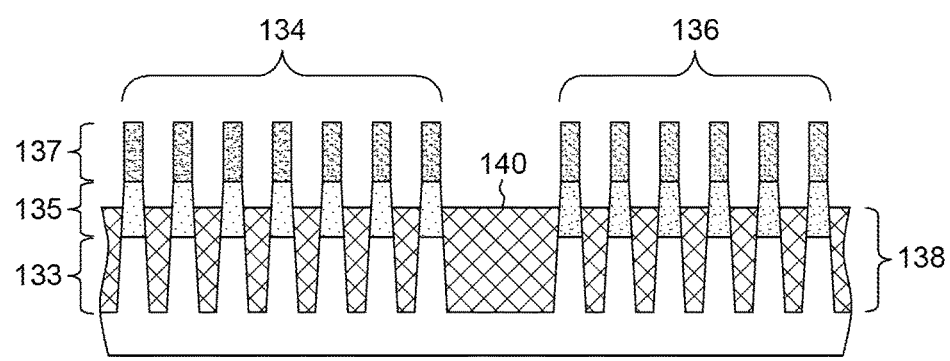
FIG. 9 depicts one example of the structure of FIG. 8 after etching the structure to create one or more raised semiconductor structures (here, fins) in each region, and surrounding a bottom portion of the raised structures with a layer of isolation material, in accordance with one or more aspects of the present invention.

FIG. 9 depicts one example of the structure of FIG. 8 after etching the structure to create one or more raised semiconductor structures in both the n and p-type regions (here, fins 134 and 136, respectively), and surrounding a bottom portion 138 of the fins with a layer 140 of isolation material, e.g., by conformal deposition, in accordance with one or more aspects of the present invention. Each fin includes a bottom portion 133, middle portion 135 and top portion 137.

Figure 10:
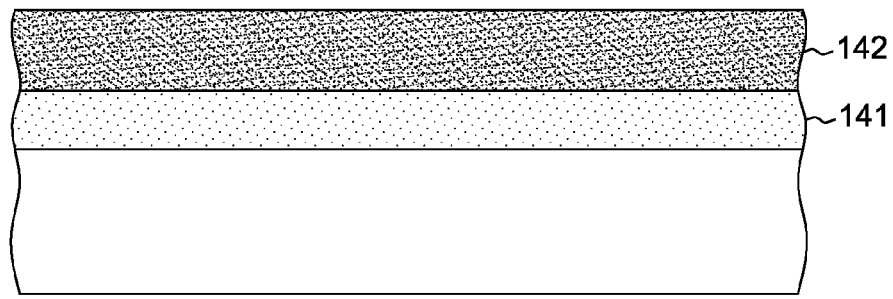
FIG. 10 depicts one example of a variant of the starting structure of FIG. 1 after creating a blanket layer of epitaxial semiconductor material lacking impurities (e.g., undoped epitaxial silicon) over a blanket layer of epitaxial semiconductor material with impurities therein, in accordance with one or more aspects of the present invention.

FIG. 10 depicts another example of a variant of the starting structure of FIG. 1, including a replacement of blanket layer 104 with blanket layer 141 of an epitaxial semiconductor material with impurities therein (e.g., boron-doped epitaxial silicon germanium), e.g., by epitaxial growth and boron implant, and creating a blanket layer 142 of epitaxial semiconductor material lacking impurities (e.g., undoped epitaxial silicon), e.g., by growth, over blanket layer 141, in accordance with one or more aspects of the present invention.

Figure 11:
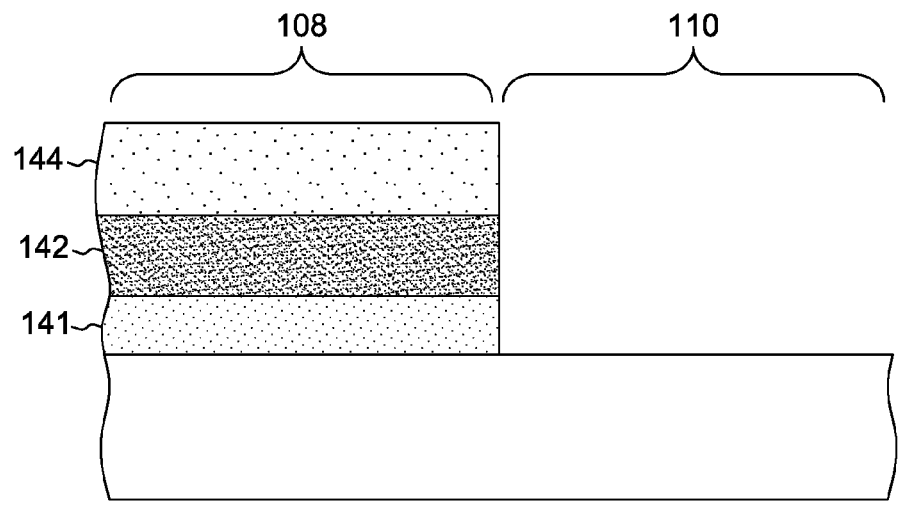
FIG. 11 depicts one example of the structure of FIG. 10 after masking a portion (here, the n-type region) of the blanket layer of epitaxial material lacking impurities with a layer of hard mask material and removing both blanket layers in the other portion (here, the p-type region) of the structure, in accordance with one or more aspects of the present invention.

FIG. 11 depicts one example of the structure of FIG. 10 after masking a portion (here, n-type region 108) of the blanket layer 142 of epitaxial material lacking impurities with a layer 144 of hard mask material, e.g., by deposition, and removing both blanket layers 142 and 141 in the other portion (here, p-type region 110) of the structure, e.g., by using a single etch, in accordance with one or more aspects of the present invention.

Figure 12:
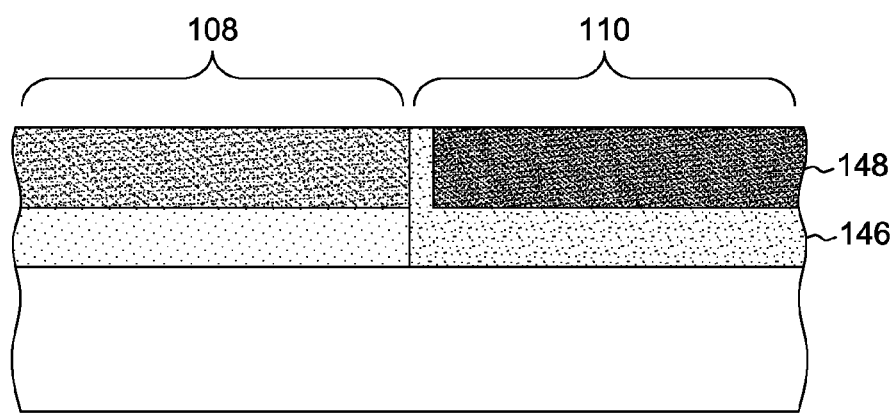
FIG. 12 depicts one example of the structure of FIG. 11 after creating a layer of epitaxial semiconductor material with impurities therein (e.g., phosphorous or arsenic doped epitaxial silicon) over the unmasked portion of the structure (here, the p-type region), creating a layer of epitaxial semiconductor material lacking impurities (e.g., undoped silicon germanium) and removing the layer of hard mask material over the other portion of the structure (here, the n-type region), in accordance with one or more aspects of the present invention.

FIG. 12 depicts one example of the structure of FIG. 11 after creating a layer 146 of epitaxial semiconductor material with impurities therein (e.g., phosphorous or arsenic doped epitaxial silicon), e.g., by epitaxial growth and arsenic implant, over the unmasked portion of the structure (here, p-type region 110), creating a layer 148 of epitaxial semiconductor material lacking impurities (e.g., undoped silicon germanium), e.g., by growth, and removing the layer (144, FIG. 11) of hard mask material over the other portion of the structure (here, n-type region 108), e.g., by etching, in accordance with one or more aspects of the present invention.

Figure 13:
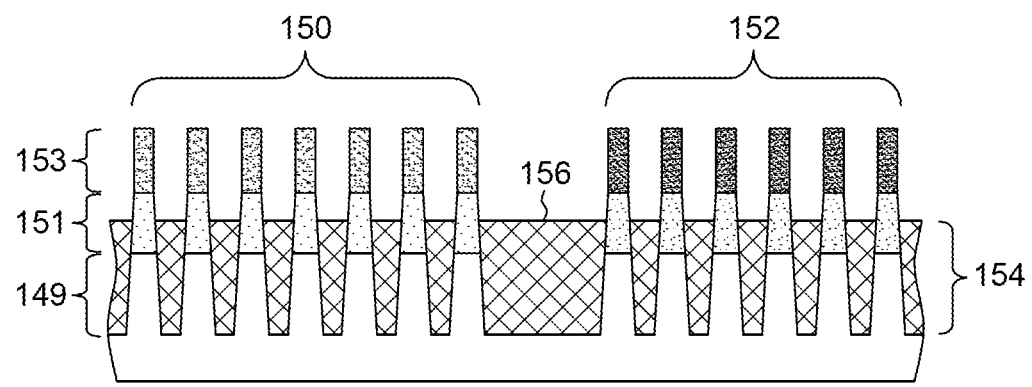
FIG. 13 depicts one example of the structure of FIG. 12 after etching the structure to create one or more raised semiconductor structures (here, fins) in each region, and surrounding a bottom portion of the raised structures with a layer of isolation material, in accordance with one or more aspects of the present invention.

FIG. 13 depicts one example of the structure of FIG. 12 after etching the structure to create one or more raised semiconductor structures in both the n and p-type regions (here, fins 150 and 152, respectively), and surrounding a bottom portion 154 of the fins with a layer 156 of isolation material, e.g., by conformal deposition, in accordance with one or more aspects of the present invention. Each fin includes a bottom portion 149, middle portion 151 and top portion 153.

In a first aspect, disclosed above is a method of reducing a risk of punch-through in a FinFET type structure. The method includes providing a semiconductor substrate, creating a blanket layer of semiconductor material with impurities therein over the substrate, masking a portion of the blanket layer, creating epitaxial semiconductor material on an unmasked portion of the structure, removing the mask, and etching the structure to create n-type raised structure(s) and p-type raised structure(s).

In one example, the substrate may include, for example, a bulk semiconductor substrate.

In one example, the method of the first aspect may further include, for example, creating a blanket top layer of epitaxial semiconductor material lacking impurities after removing the mask and before etching the structure.

In one example, the masked portion in the method of the first aspect may include, for example, one of a n-type region and a p-type region.

In one example, creating the epitaxial semiconductor material may include, for example, creating epitaxial semiconductor material of a type opposite the type of the masked portion.

In one example, the blanket layer in the method of the first aspect may include, for example, epitaxial semiconductor material with impurities therein. In one example, where the epitaxial semiconductor material is present, the method may further include, for example, creating a top blanket layer of epitaxial semiconductor material lacking impurities over the blanket layer of semiconductor material with impurities prior to the masking. In one example, where the top blanket layer is present, the structure may include, for example, a n-type region and a p-type region, the masking may include, for example, masking the n-type region, and the method may further include, for example, removing both blanket layers on the p-type region. In one example, creating the epitaxial semiconductor material on the unmasked portion may include, for example, creating p-type epitaxial semiconductor material on the p-type region after removing both blanket layers, and the method may further include, for example, creating a top layer of epitaxial semiconductor material lacking impurities on the p-type region prior to removing the mask.

In a second aspect, disclosed above is a semiconductor structure. The semiconductor structure includes a semiconductor substrate, and raised semiconductor structure(s) coupled to the substrate, a bottom portion of the raised structure(s) being surrounded by isolation material. A middle portion of the raised structure(s) includes a semiconductor material with impurities therein, the middle portion extending across the raised structure(s), and the top portion includes a semiconductor material lacking added impurities.

In one example, the semiconductor material with impurities therein may include, for example, epitaxial semiconductor material. In one example, where the epitaxial semiconductor material is present, the structure may include, for example, a n-type region and a p-type region, and the epitaxial semiconductor material with impurities therein may include, for example, boron-doped epitaxial silicon germanium.

In one example, the raised structure(s) of the semiconductor structure of the second aspect may include, for example, a n-type raised structure and a p-type raised structure, the semiconductor structure may be silicon-based, and a middle portion of the p-type raised structure may include, for example, phosphorous-doped silicon. In one example, the phosphorous-doped silicon may include, for example, phosphorous-doped epitaxial silicon.

In one example, the raised structure(s) of the semiconductor structure of the second aspect may include, for example, a n-type raised structure and a p-type raised structure, the semiconductor structure may be silicon-based, and a middle portion of the p-type raised structure may include, for example, arsenic-doped silicon. In one example, the arsenic-doped silicon may include, for example, arsenic-doped epitaxial silicon.

In one example, the raised structure(s) of the semiconductor structure of the second aspect may include, for example, a n-type raised structure and a p-type raised structure, the semiconductor structure may be silicon-based, and the top portion of the p-type raised structure may include, for example, epitaxial silicon germanium lacking added impurities.

In one example, the semiconductor structure of the second aspect may further include, for example, a gate surrounding a top portion of the raised structure(s).

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
a substrate; and
at least one semiconductor fin coupled to the substrate, a bottom portion of the at least one semiconductor fin being surrounded by isolation material;
wherein a middle portion of the at least one semiconductor fin comprises a semiconductor material with impurities therein, wherein the middle portion extends across the at least one semiconductor fin, wherein a top portion of the semiconductor fin comprises a semiconductor material lacking added impurities, wherein the semiconductor material with impurities therein comprises epitaxial semiconductor material, wherein the semiconductor structure comprises a n-type region and a p-type region, and wherein the epitaxial semiconductor material with impurities therein comprises boron-doped epitaxial silicon germanium.

2. The semiconductor structure of claim 1, wherein the at least one semiconductor fin comprises a n-type fin and a p-type fin, wherein the semiconductor structure is silicon-based, and wherein a middle portion of the p-type fin comprises phosphorous-doped silicon.

3. The semiconductor structure of claim 2, wherein the phosphorous-doped silicon comprises phosphorous-doped epitaxial silicon.

4. The semiconductor structure of claim 1, further comprising a gate surrounding a top portion of the at least one semiconductor fin.

5. A semiconductor structure, comprising:
a substrate;
at least one semiconductor fin coupled to the substrate, a bottom portion of the at least one semiconductor fin being surrounded by isolation material; and
wherein a middle portion of the at least one semiconductor fin comprises a semiconductor material with impurities therein, wherein the middle portion extends across the at least one semiconductor fin, wherein a top portion of the semiconductor fin comprises a semiconductor material lacking added impurities, wherein the at least one semiconductor fin comprises a n-type fin and a p-type fin, wherein the semiconductor structure is silicon-based, and wherein the top portion of the p-type fin comprises epitaxial silicon germanium lacking added impurities.

6. A semiconductor structure, comprising:
a substrate; and
at least one semiconductor fin coupled to the substrate, a bottom portion of the at least one semiconductor fin lacking added impurities being surrounded by isolation material; and
wherein a middle portion of the at least one semiconductor fin comprises a semiconductor material with impurities therein, wherein the middle portion extends across the at least one semiconductor fin, and wherein a top portion of the semiconductor fin comprises a semiconductor material lacking added impurities.

7. The semiconductor structure of claim 6, wherein the at least one semiconductor fin comprises a n-type fin and a p-type fin, wherein the semiconductor structure is silicon-based, and wherein a middle portion of the p-type fin comprises arsenic-doped silicon.

8. The semiconductor structure of claim 7, wherein the arsenic-doped silicon comprises arsenic-doped epitaxial silicon.

9. The semiconductor structure of claim 6, wherein the semiconductor material with impurities therein comprises epitaxial semiconductor material.

10. The semiconductor structure of claim 9, wherein the semiconductor structure comprises a n-type region and a p-type region, and wherein the epitaxial semiconductor material with impurities therein comprises boron-doped epitaxial silicon germanium.

11. The semiconductor structure of claim 6, wherein the at least one semiconductor fin comprises a n-type fin and a p-type fin, wherein the semiconductor structure is silicon-based, and wherein a middle portion of the p-type fin comprises phosphorous-doped silicon.

12. The semiconductor structure of claim 11, wherein the phosphorous-doped silicon comprises phosphorous-doped epitaxial silicon.

* * * * *